United States Patent
Jing et al.

(10) Patent No.: US 10,201,965 B2
(45) Date of Patent: Feb. 12, 2019

(54) TRANSFER DEVICE AND COATING MACHINE

(71) Applicants: BOE Technology Group Co., Ltd., Beijing (CN); Hefei BOE Optoelectronics Technology Co., Ltd., Anhui (CN)

(72) Inventors: Yangkun Jing, Beijing (CN); Mancheng Liu, Beijing (CN); Shengguang Sang, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 13 days.

(21) Appl. No.: 15/298,886

(22) Filed: Oct. 20, 2016

(65) Prior Publication Data

US 2017/0217153 A1 Aug. 3, 2017

(30) Foreign Application Priority Data

Feb. 2, 2016 (CN) .......................... 2016 1 0074209

(51) Int. Cl.
*B41F 16/00* (2006.01)
*C23C 14/22* (2006.01)

(52) U.S. Cl.
CPC .............. *B41F 16/00* (2013.01); *C23C 14/22* (2013.01)

(58) Field of Classification Search
CPC .. B41F 27/12; B41F 27/1292; B41F 27/1212; B41F 27/1268; B41F 16/00; C23C 14/22
See application file for complete search history.

(56) References Cited

U.S. PATENT DOCUMENTS 5,245,923 A * 9/1993 Vrotacoe .................... B41F 7/04
101/217
6,000,336 A * 12/1999 Leib ........................ B41F 13/08
101/216
6,581,517 B1 * 6/2003 Becker .................... B41F 13/18
101/389.1

(Continued)

FOREIGN PATENT DOCUMENTS

CN 1514283 A 7/2004
CN 1938156 A 3/2007

(Continued)

OTHER PUBLICATIONS

Jul. 19, 2017—(CN) Office action application 201610074209.1 with English translation.

*Primary Examiner* — David Banh
(74) *Attorney, Agent, or Firm* — Banner & Witcoff, Ltd.

(57) ABSTRACT

A transfer device and a coating machine are disclosed. The transfer device includes a transfer plate and a printing roller. A projection is formed on a first surface of the transfer plate; a first recess corresponding to the projection is formed on the printing roller; and when the transfer plate covers a surface of the printing roller, the projection and the first recess are matched with each other to fix the transfer plate with the printing roller. The transfer plate in the transfer device will not be subjected to extended deformation and sliding even under an action of external force during printing process, so that the production quality can be maximally guaranteed.

11 Claims, 3 Drawing Sheets

(56) References Cited

U.S. PATENT DOCUMENTS

| | | | | |
|---|---|---|---|---|
| 6,796,233 | B2* | 9/2004 | Brown | B41F 13/10 |
| | | | | 101/248 |
| 7,036,429 | B2* | 5/2006 | Knauer | B41F 30/04 |
| | | | | 101/216 |
| 2002/0002921 | A1* | 1/2002 | Hoffmann | B41N 6/00 |
| | | | | 101/376 |
| 2003/0047097 | A1* | 3/2003 | Dzierzynski | B41N 6/00 |
| | | | | 101/368 |
| 2003/0205156 | A1* | 11/2003 | Belanger | B41F 27/105 |
| | | | | 101/376 |
| 2004/0126540 | A1 | 7/2004 | Byun et al. | |
| 2005/0235849 | A1* | 10/2005 | Lorig | B41C 1/18 |
| | | | | 101/375 |
| 2008/0276814 | A1* | 11/2008 | Knauer | B41F 13/193 |
| | | | | 101/219 |
| 2009/0193991 | A1* | 8/2009 | Rossini | B41N 10/02 |
| | | | | 101/453 |
| 2012/0223203 | A1 | 9/2012 | Chan et al. | |
| 2016/0347106 | A1 | 12/2016 | Wang et al. | |

FOREIGN PATENT DOCUMENTS

| | | |
|---|---|---|
| CN | 201275917 Y | 7/2009 |
| CN | 202421679 U | 9/2012 |
| CN | 203232229 U | 10/2013 |
| CN | 204028506 U | 12/2014 |
| CN | 204451464 U | 7/2015 |
| CN | 104849914 A | 8/2015 |
| CN | 204659159 U | 9/2015 |
| EP | 1725404 A1 | 11/2006 |
| KR | 200382204 Y1 | 4/2005 |
| KR | 1020070051423 A | 5/2007 |
| KR | 1020110134705 A | 12/2011 |

* cited by examiner

TRANSFER DEVICE AND COATING MACHINE

This application claims priority to and the benefit of Chinese Patent Application No. 201610074209.1 filed on Feb. 2, 2016, which application is incorporated herein in its entirety.

TECHNICAL FILED

Embodiments of the present invention relate to a transfer device and a coating machine.

BACKGROUND

A transfer plate of an existing coating machine is usually fixed on a printing roller, with face downward, by mechanical means. When such coating machine is adopted for production and printing, the transfer plate may be subjected to extended deformation and sliding under an external pressing force applied by an anilox roller and a pedestal, which may result in printing deviation and hence poor product quality.

SUMMARY

Embodiments of the present invention provide a transfer device and a coating machine, which overcomes the above-mentioned defects such as extended deformation and unwanted sliding.

In order to achieve the objective above, the embodiments of the present invention adopt technical solutions as below.

On one aspect, a transfer device is provided, comprising a transfer plate and a printing roller, wherein a projection is formed on a first surface of the transfer plate, a first recess corresponding to the projection is formed on the printing roller, and the projection and the first recess are matched with each other upon the transfer plate covering a surface of the printing roller, so as to fix the transfer plate with the printing roller.

On the other aspect, a coating machine is provided, comprising the above-mentioned transfer device.

BRIEF DESCRIPTION OF THE DRAWINGS

Hereafter, the embodiments of the present invention will be descried in detail with reference to the accompanying drawings, so as to make those skilled in the art understand the present invention more clearly, wherein.

DETAILED DESCRIPTION

Hereafter, the technical solutions of the embodiments of the present disclosure will be described in a clear and complete way in connection with the drawings related to the embodiments of the present disclosure. It is obvious that the described embodiments are just a part but not all of the present disclosure. Based on the described embodiments of the present disclosure, those ordinarily skilled in the art can obtain other embodiment(s), without any inventive work, which come(s) within the scope sought for protection by the present disclosure.

Unless otherwise defined, the technical terminology or scientific terminology used herein should have the same meaning as commonly understood by one of ordinary skill in the art to which this invention belongs. Terms used in the present description and claims such as "first", "second" and so on are only used for distinguishing different components, and cannot be construed as indicating or implying sequence, amount and relative importance. Likewise, a term "a," "an," or "the" does not indicate limitation in number, but specifies the presence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Generally, an alignment film in a display panel is configured to achieve ordered arrangement of liquid crystal molecules. The liquid crystal molecules are rotated by a certain angle correspondingly under an action of electrical field so that backlight can be transmitted from a polarizer through the rotated liquid crystals to achieve display effect.

Figure 1:
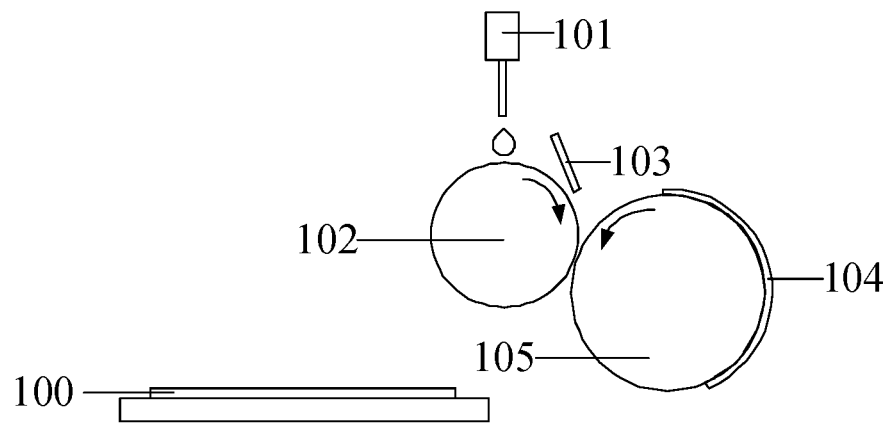
FIG. 1 is a schematically structural view illustrating a coating system.

FIG. 1 is a schematically structural view of an alignment film coating system. The process of coating an alignment film by utilizing the coating system includes steps of: providing polyimide (PI) onto an anilox roller 102 through a distributor 101; uniformly coating the PI throughout the anilox roller 102 by using a scraper 103; printing the PI onto a transfer plate (Asai Kasai Photosenstive Resin Plate, APR Plate for short) on which patterns are pre-formed, through the anilox roller 102; and allowing a printing roller 105 fixed with the transfer plate 104 to transfer the PI onto a glass substrate 100 through the transfer plate 104 to finally form an alignment film.

Figure 2:
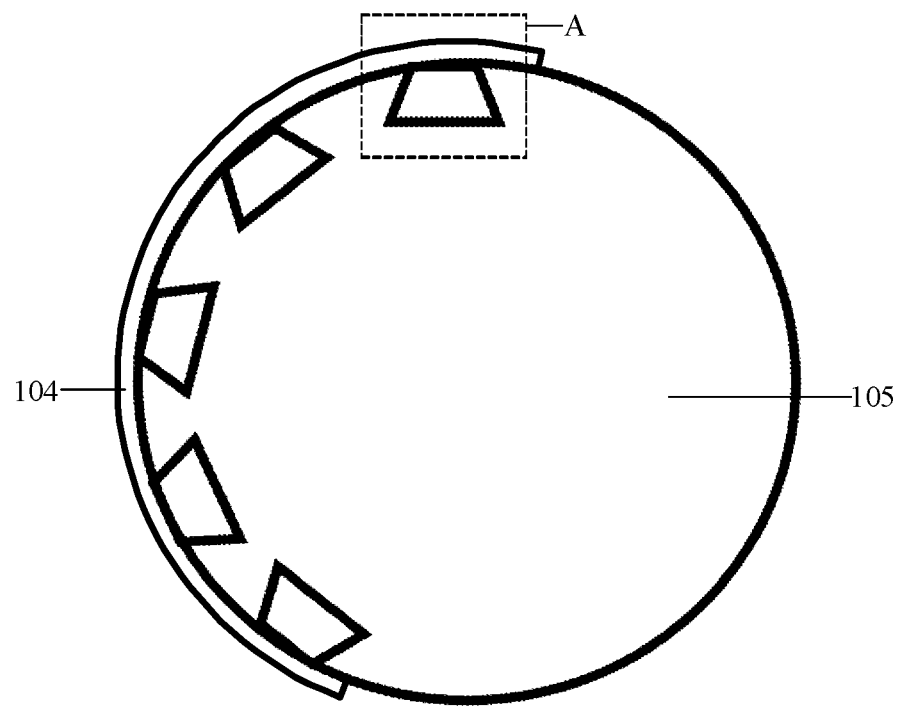
FIG. 2 is a sectional view illustrating a transfer device provided by an embodiment of the present invention.
Figure 3:
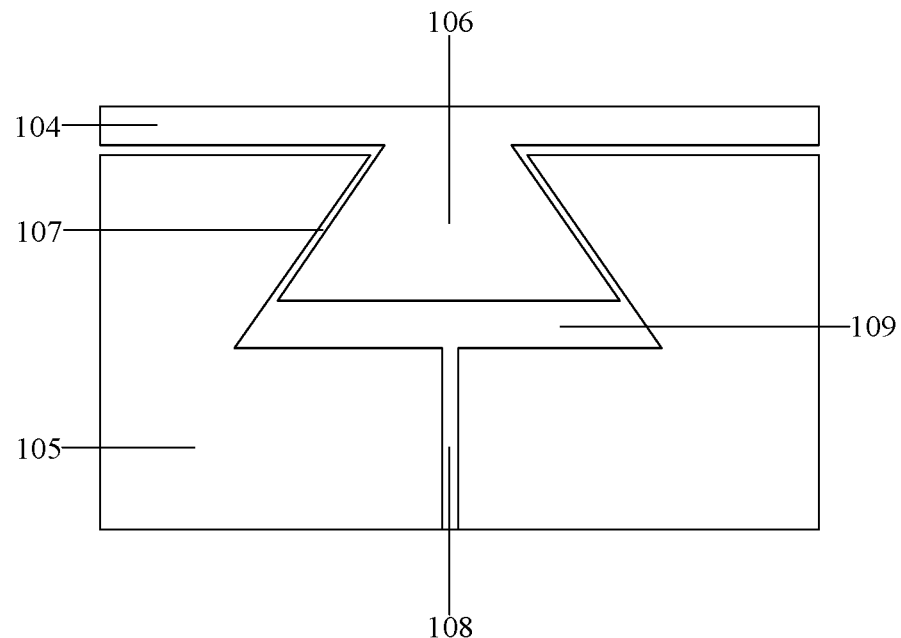
FIG. 3 is a schematically structural view illustrating an enlarged portion A of the transfer device as illustrated in FIG. 2.

FIG. 2 is a sectional view of a transfer device provided by an embodiment of the present invention, and FIG. 3 is a structural view of an enlarged portion A of the transfer device in FIG. 2. As illustrated in FIG. 2 and FIG. 3, the transfer device provided by the embodiment of the present invention comprises a transfer plate 104 and a printing roller 105. A projection 106 is disposed on a first surface of the transfer plate 104, and a first recess 107 corresponding to the projection 106 is disposed on the printing roller 105. For example, the projection can have a shape of inverted trapezoid. When the transfer plate 104 covers a surface of the printing roller 105, the projection 106 and the first recess 107 can be matched with each other to fix the transfer plate 104 with the printing roller 105.

As described above, in the technical solution provided by the embodiment of the present invention, the transfer plate is fixed on the printing roller by an engagement between the projection and the recess, instead of mechanical means. Thus, even under the action of external force during printing process, the transfer plate will no longer be subjected to extended deformation or unwanted sliding. Therefore, the transfer device provided by the embodiment of the present invention can avoid the extended deformation and unwanted sliding of the transfer plate, avoid the problem of deviation during production and printing, and maximally ensure the product quality.

As illustrated in FIG. 3, in an example, a first air duct 108 is disposed at a bottom of the first recess 107 and configured to extract air from a sealed space 109 between the projection 106 and the first recess 107, so as to generate an inward tension force to the projection 106. The inward tension force is just a vacuum adsorption force, through which the transfer plate 104 can be firmly adsorbed on the printing roller 105.

As described above, the technical solution provided by the embodiment can more firmly adsorb the transfer plate on the printing roller by the means of vacuum adsorption, can further avoid the extended deformation and sliding of the transfer plate, avoid the problem of deviation during production and printing, and maximally ensure the product quality.

In the example provided with a first air duct, the first air duct 108 is configured to generate the inward tension force to the projection 106, so that a second recess (not illustrated) is formed on a second surface of the transfer plate 104. The second recess is arranged opposite to the projection 106 and can be configured to accommodate alignment liquid. Optionally, the first air duct 108 is also configured to adjust the inward tension force, so as to adjust a volume of the second recess. Therefore, the transfer device provided by the embodiment of the present invention can control the volume of PI liquid accommodated in the transfer plate by adjusting the vacuum adsorption force.

In actual application, normally, the printing roller will be replaced by a new appropriate one when it needs to change a thickness of the alignment film as formed. As a contrast, according to the embodiment of the present invention, an amount of PI liquid accommodated in the second recess can be adjusted simply by adjusting the volume of the second recess so as to finally change a film thickness formed by the transfer plat without the need of replacing the printing roller. In addition, by controlling the volume of the second recess of the transfer plate, it can also adjust the amount of the PI liquid accommodated in the second recess. Therefore, the transfer device provided by the embodiment of the present invention can optimize both the orientation and the uniformity of the alignment film, enhance the ordered arrangement of liquid crystal molecules, and improve the contrast ratio of the display panel.

In an example, a second air duct can be disposed at the bottom of the first recess 107. For instance, the first air duct 108 and the second air duct (hereinafter labeled as "18") can be a same air duct. The second air duct 108 is configured to charge air into the sealed space 109 between the projection 106 and the first recess 107, so as to generate an outward thrust force to the projection 106. Thus, when a monitor finds abnormal condition of the transfer plate, it no longer requires manual plate hanging; instead, a clamping force on the transfer plate 104 can be lessened by charging air into the sealed space 109 through the second air duct 108 so as to loosen the transfer plate 104; subsequently, the transfer plate 104 can be retightened by the vacuum adsorption through the first air duct 108, and finally be restored to the optimum state. Therefore, the transfer device provided by the embodiment of the present invention can loosen and tighten the transfer plate in a fully automatic, more convenient and rapid manner, and hence can improve the productivity.

Figure 4:
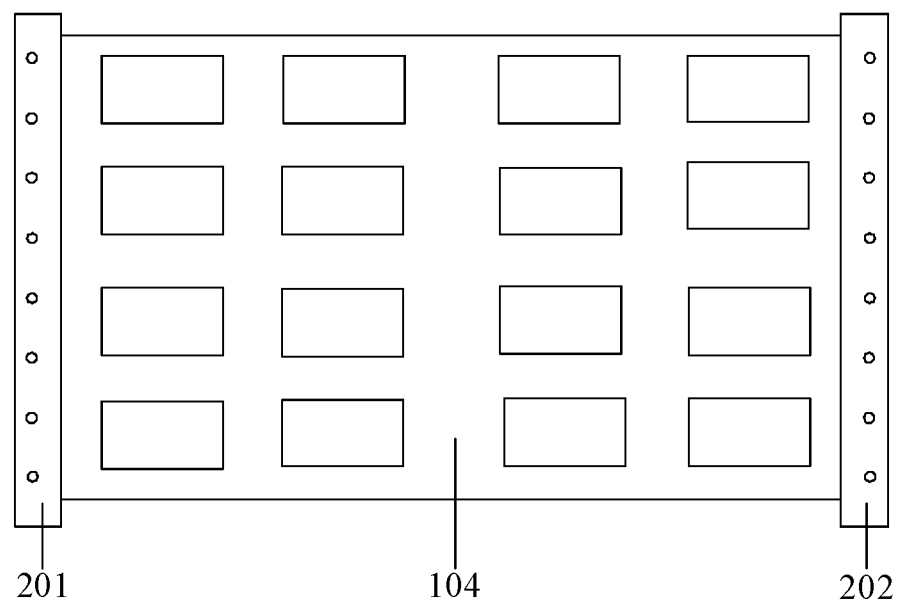
FIG. 4 is a schematically structural view of a clamp in a transfer device provided by an embodiment of the present invention.

As illustrated in FIG. 4, in an example, the transfer device further comprises a first clamp 201 and a second clamp 202 which are arranged opposite to each other. The first clamp 201 includes a first cover plate and a first bottom plate, while the second clamp 202 includes a second cover plate and a second bottom plate. Both the first bottom plate and the second bottom plate are fixedly connected with the printing roller 105. A side of the transfer plate 104 is disposed between the first cover plate and the first bottom plate, and the other side of the transfer plate 104 is disposed between the second cover plate and the second bottom plate. The first clamp 201 is configured to control an acting force between the first cover plate and the first bottom plate, so as to mount or demount the transfer plate. The second clamp 202 is configured to control an acting force between the second cover plate and the second bottom plate, so as to mount or demount the transfer plate. In this way, the transfer device provided by the embodiment of the present invention can more conveniently and rapidly mount and demount the transfer plate.

Figure 5:
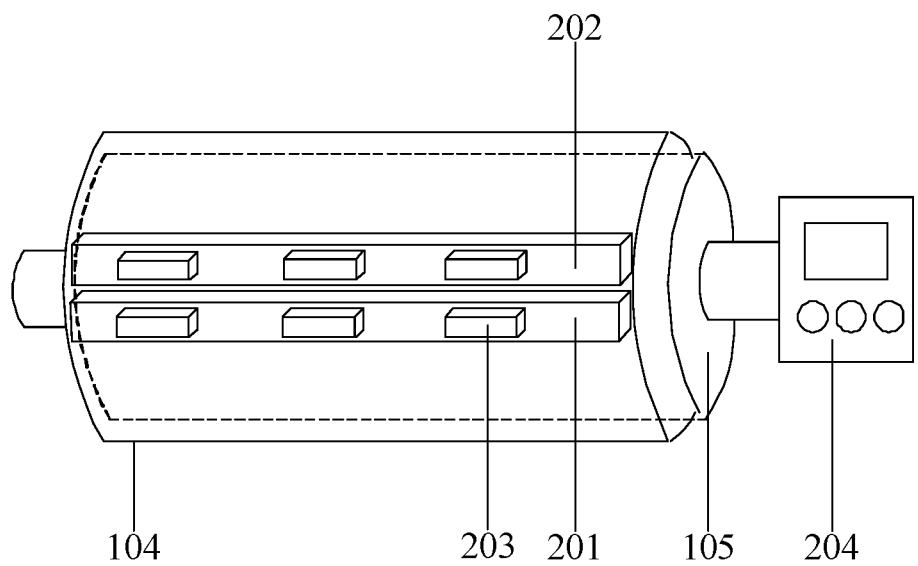
FIG. 5 is an elevation view illustrating a transfer device provided by an embodiment of the present invention.

FIG. 5 is an elevation view of the transfer device provided by the embodiment of the present invention. As illustrated in FIG. 5, a permanent magnet is disposed in each of the first cover plate and the second cover plate, and an electromagnet 203 is disposed in each of the first bottom plate and the second bottom plate. The first clamp 201 is configured to adjust the direction and magnitude of the current in the electromagnet 203 of the first bottom plate, so as to control the acting force between the first cover plate and the first bottom plate. The second clamp 202 is configured to adjust the direction and magnitude of the current in the electromagnet 203 of the second bottom plate, so as to control the acting force between the second cover plate and the second bottom plate.

Moreover, still referring to FIG. 5, in another example, materials of forming the first cover plate and the second cover plate include ferromagnetic materials, and an electromagnet 203 is disposed in each of the first bottom plate and the second bottom plate. The first clamp 201 is configured to adjust the magnitude of the current in the electromagnet 203 of the first bottom plate, so as to control the acting force between the first cover plate and the first bottom plate. The second clamp 202 is configured to adjust the magnitude of the current in the electromagnet 203 of the second bottom plate, so as to control the acting force between the second cover plate and the second bottom plate.

As described above, in the transfer device provided by the embodiment of the present invention, the acting force between the cover plate and the bottom plate of the clamp is controlled by adjusting the direction and magnitude of the current in the clamp, so as to finally achieve assembling and disassembling of the transfer plate 104.

Moreover, still referring to FIG. 5, in an example, a monitor 204 is disposed on a side of the printing roller 105. Thus, when the transfer plate 104 is fixed on the printing roller 105 through the first clamp 201 and the second clamp 202, the monitor 204 is configured to provide an indication when the pressure intensity in the sealed space 109 exceeds a default value. Optionally, the default value is ranged from −50 Pa to −80 Pa. When the pressure intensity in the sealed space 109 is greater than the default value, it indicates an abnormal condition during the fixing of the transfer plate 104 and the printing roller 105. At this point, the monitor 204 gives out an alarm and hence can conveniently detect abnormal adsorption areas. Subsequently, the transfer plate can be manually or automatically re-hung. The automatic plate hanging process of the transfer device provided by the embodiment of the present invention includes: charging air into the sealed space 109 through the second air duct 108 so as to loosen the transfer plate 104; retightening the transfer plate 104 by vacuum adsorption through the first air duct 108; and finally allowing the transfer plate 104 to be restored to the optimum state.

As described above, the transfer device provided by the embodiment of the present invention can automatically detect the fixing condition between transfer plate and the printing roller, can loosen and retighten the transfer plate in fully automatic, more convenient and rapid manner, and can also improve the productivity.

The transfer device provided by the embodiment of the present invention comprises the transfer plate and the printing roller. The projection of the transfer plate and the recess of the printing roller are matched with each other to fix the transfer plate and the printing roller. Thus, not only the problem of alignment of the transfer plate and the printing roller can be solved but also the alignment and the uniformity of the alignment film can be optimized by adjusting the volume of the transfer plate for accommodating PI. Therefore, the ordered arrangement of the liquid crystal molecules can be enhanced, and finally the contrast ratio of the display panel can be improved. In addition, in the transfer device provided by the embodiment of the present invention, the transfer plate is firmly adsorbed on the printing roller by vacuum adsorption instead of mechanical means, so the transfer plate will no longer be subjected to extended deformation and unwanted sliding even under an action of external force during printing process. Therefore, the technical solution provided by the embodiments of the present invention can avoid the extended deformation and sliding of the transfer plate, avoid the problem of deviation during production and printing, and maximally ensure the product quality.

On the basis of the same invention concept, the embodiment of the present invention further provides a coating machine comprising the transfer device provided by any of the foregoing embodiment. Specific details may refer to the description of the foregoing without repeating herein.

Similarly, in the coating machine provided by the embodiment of the present invention, the transfer device includes the transfer plate and the printing roller. The projection of the transfer plate and the recess of the printing roller are matched with each other to fix the transfer plate and the printing roller. Thus, not only the problem of alignment of the transfer plate and the printing roller can be solved but also the alignment and the uniformity of the alignment film can be optimized by adjusting the volume of the transfer plate for accommodating PI. Therefore, the ordered arrangement of the liquid crystal molecules can be enhanced, and finally the contrast ratio of the display panel can be improved. In addition, in the coating machine provided by the embodiment of the present invention, the transfer plate is firmly adsorbed on the printing roller by vacuum adsorption instead of mechanical means, so the transfer plate will no longer be subjected to extended deformation or unwanted sliding even under an action of external force during printing process. Therefore, the technical solution provided by the embodiments of the present invention can avoid the extended deformation and unwanted sliding of the transfer plate, avoid the problem of deviation during production and printing, and maximally ensure the product quality.

The foregoing are merely specific embodiments of the invention, but not limitative to the protection scope of the present disclosure. Therefore, the protection scope of the invention should be defined by the accompanying claims.

The present application claims the priority of the Chinese patent application No. 201610074209.1 filed on Feb. 2, 2016, the entirety of which is incorporated herein by reference as a part of the present application.

What is claimed is:

1. A transfer device, comprising a transfer plate and a printing roller, wherein a projection is formed on a first surface of the transfer plate, a first recess corresponding to the projection is formed on the printing roller, and the projection and the first recess are configured, upon being matched with each other and with the transfer plate covering a surface of the printing roller, to fix the transfer plate with the printing roller, wherein a first air duct is disposed at a bottom of the first recess and is configured to extract air from a sealed space between the projection and the first recess, so as to generate an inward tension force to the projection, and the first air duct is configured to generate the inward tension force to the projection so that a second recess is formed on a second surface of the transfer plate, and the second recess is arranged opposite to the projection and configured to accommodate alignment liquid.

2. The transfer device according to claim 1, wherein the first air duct is also configured to adjust the inward tension force, so as to adjust a volume of the second recess.

3. The transfer device according to claim 1, wherein a second air duct is disposed at the bottom of the first recess and configured to charge air into the sealed space between the projection and the first recess, so as to generate an outward thrust force to the projection.

4. The transfer device according to claim 3, wherein the first air duct and the second air duct are a same air duct.

5. The transfer device according to claim 1, further comprising a monitor disposed on a side of the printing roller, wherein the monitor is configured to provide an indication upon a pressure intensity in the sealed space being greater than a default value.

6. The transfer device according to claim 5, wherein the default value is in a range from −50 Pa to −80 Pa.

7. The transfer device according to claim 1, further comprising a first clamp and a second clamp, wherein the first clamp includes a first cover plate and a first bottom plate, while the second clamp includes a second cover plate and a second bottom plate; both the first bottom plate and the second bottom plate are fixedly connected with the printing roller; one side of the transfer plate is disposed between the first cover plate and the first bottom plate, and the other side of the transfer plate is disposed between the second cover plate and the second bottom plate;

the first clamp is configured to control an acting force between the first cover plate and the first bottom plate, so as to mount or demount the transfer plate; and the second clamp is configured to control an acting force between the second cover plate and the second bottom plate, so as to mount or demount the transfer plate.

8. The transfer device according to claim 7, wherein a permanent magnet (PM) is disposed in each of the first cover plate and the second cover plate, and an electromagnet is disposed in each of the first bottom plate and the second bottom plate;

the first clamp is configured to adjust a direction and a magnitude of current in the electromagnet of the first bottom plate, so as to control the acting force between the first cover plate and the first bottom plate; and the second clamp is configured to adjust a direction and a magnitude of current in the electromagnet of the second bottom plate, so as to control the acting force between the second cover plate and the second bottom plate.

9. The transfer device according to claim 7, wherein a material of forming the first cover plate and the second cover plate comprises ferromagnetic material, and an electromagnet is disposed in each of the first bottom plate and the second bottom plate;
- the first clamp is configured to adjust a magnitude of current in the electromagnet of the first bottom plate, so as to control the acting force between the first cover plate and the first bottom plate; and
- the second clamp is configured to adjust a magnitude of current in the electromagnet of the second bottom plate, so as to control the acting force between the second cover plate and the second bottom plate.

10. The transfer device according to claim 1, wherein a shape of the projection comprises an inverted trapezoid.

11. A coating machine, comprising the transfer device according to claim 1.

\* \* \* \* \*